United States Patent [19]

Kinbara et al.

[11] Patent Number: 5,692,940
[45] Date of Patent: Dec. 2, 1997

[54] SHEET MATERIAL FOR LAMINATE OF PRINTED CIRCUIT AND LAMINATE FOR PRINTED CIRCUIT USING THE SAME

[75] Inventors: Hidenori Kinbara; Mitsuru Nozaki; Masanobu Mizoguchi, all of Tokyo; Koji Kimura; Naohiko Shimono, both of Ibaraki, all of Japan

[73] Assignees: Mitsubishi Gas Chemical Company, Ltd.; Japan Vilene Company, Ltd., both of Tokyo, Japan

[21] Appl. No.: 676,180

[22] PCT Filed: Nov. 15, 1995

[86] PCT No.: PCT/JP95/02328

§ 371 Date: Jul. 15, 1996

§ 102(e) Date: Jul. 15, 1996

[87] PCT Pub. No.: WO96/15306

PCT Pub. Date: May 23, 1996

[30] Foreign Application Priority Data

Nov. 15, 1994  [JP]  Japan .................. 6-305429

[51] Int. Cl.$^6$ .............. B32B 5/06; B32B 9/00; B32B 27/06; B32B 31/00
[52] U.S. Cl. .......... 442/408; 428/409; 428/480; 428/901; 156/272.6; 156/307.7
[58] Field of Search ............... 428/1, 224, 299, 428/300, 290, 296, 320.2, 480, 901, 409; 156/272.6, 307.7, 307.3; 442/408

[56] References Cited

U.S. PATENT DOCUMENTS

| | | | |
|---|---|---|---|
| 3,958,072 | 5/1976 | Araki et al. ............... | 156/272.6 |
| 4,008,352 | 2/1977 | Dawes et al. ............. | 156/272.6 |
| 4,103,102 | 7/1978 | Klein ........................ | 174/255 |
| 4,137,357 | 1/1979 | Emmons .................... | 428/245 |
| 4,139,591 | 2/1979 | Jurisich .................... | 428/245 |
| 5,137,594 | 8/1992 | Asada et al. .............. | 428/224 |
| 5,169,710 | 12/1992 | Qureshi et al. ............ | 428/245 |
| 5,314,742 | 5/1994 | Kirayoglu et al. ......... | 428/901 |
| 5,350,621 | 9/1994 | Yuhas et al. .............. | 428/901 |
| 5,494,604 | 2/1996 | Chung ...................... | 428/1 |

FOREIGN PATENT DOCUMENTS

| | | |
|---|---|---|
| 62-36891 | 2/1987 | Japan . |
| 62-36892 | 2/1987 | Japan . |
| 62-223398 | 10/1987 | Japan . |
| 3-29387 | 2/1991 | Japan . |
| 5-33023 | 8/1993 | Japan . |

OTHER PUBLICATIONS

Abstract of Japanese Unexamined Patent Publication No. 2-269864 (Nov. 5, 1990).
Abstract of Japanese Unexamined Patent Publication No. 3-35025 (Feb. 15, 1991).
Abstract of Japanese Unexamined Patent Publication No. 3-183185 (Aug. 9, 1991).
Abstract of Japanese Unexamined Patent Publication No. 4-123484 (Apr. 23, 1992).

*Primary Examiner*—Cathy F. Lam
*Attorney, Agent, or Firm*—Sughrue,Mion,Zinn,Macpeak & Seas, PLLC

[57] ABSTRACT

A substrate for a laminate which comprises a nonwoven fabric which is composed mainly of a liquid crystal polyester fiber, and which is subjected to (1) an entangling treatment, (2) a heating treatment to impart adhesivity to a thermosetting resin, and (3) a surface-modifying treatment, and a laminate containing at least one prepreg prepared by impregnating the substrate with a thermosetting resin and drying are disclosed. The substrate of the present invention has low dielectric constant, is light, exhibits low hygroscopicity, and has good properties to be impregnated with the thermosetting resin and good adhesiveness to the thermosetting resin.

6 Claims, No Drawings

SHEET MATERIAL FOR LAMINATE OF PRINTED CIRCUIT AND LAMINATE FOR PRINTED CIRCUIT USING THE SAME

TECHNICAL FIELD

The present invention relates to a printed circuit laminate, and a substrate therefor.

BACKGROUND ART

Hitherto, a material prepared using a glass fabric was generally used as a substrate for a printed circuit laminate. However, there are disadvantages that glass has high dielectric constant and weighs much. A substrate made of aromatic polyamide fibers was proposed for weight-saving, but it had disadvantageously highwater-absorbability.

Further, substrates using liquid crystal polyester fibers which weigh little and have low dielectric constant are disclosed in, for example, Japanese Unexamined Patent Publication (Kokai) No. 62-36892, Japanese Examined Utility Model Publication (Kokoku) No. 5-33023 and Japanese Unexamined Patent Publication (Kokai) No. 3-29387. However, such substrates have poor adhesive properties to thermosetting resin. When a laminate is prepared by impregnating the substrates with thermosetting resin, the thermosetting resin is prone to be peeled from the substrates, and then, the peeled portion absorbs moisture to cause a defect in insulation.

DISCLOSURE OF INVENTION

Accordingly, the object of the present invention is to provide a substrate which remedies the above disadvantages of the prior art, has low dielectric constant, weighs little, has low water-absorbability, properties to be effectively impregnated with thermosetting resin, and excellent adhesive properties to thermosetting resin, and to provide a printed circuit laminate using the same.

Another object of the present invention is to provide a printed circuit laminate having a good workability by a drill in addition to the above excellent properties.

The above objects may be achieved by the present invention relating to a substrate for a printed circuit laminate, characterized by comprising a nonwoven fabric which is composed mainly of a liquid crystal polyester fiber, and which is subjected to
(1) an entangling treatment,
(2) a heating treatment to impart adhesivity to a thermosetting resin [hereinafter sometimes simply referred to as "adhesivity-imparting-heating treatment"], and
(3) a surface-modifying treatment.

Further, the present invention also relates to a printed circuit laminate, characterized by containing at least one prepreg prepared by impregnating said substrate with thermosetting resin and then drying.

BEST MODE FOR CARRYING OUT THE INVENTION

The liquid crystal polyester fiber which is used in the present invention may be prepared by spinning liquid crystal polyester resin. The term "liquid crystal polyester resin" used herein means a polymer which can form an anisotropic melt phase. The polymer contains regular and parallel orientations in the molecular chain, is generally elongated and flattened, and has a high stiffness in the direction of the elongated axis of the molecule. The anisotropic melt phase may be easily confirmed, for example, by means of a usual method for measuring deflection using crossed polarizers.

The liquid crystal polyester fiber which may be used in the present invention is not limited so long as it is prepared by spinning the liquid crystal polyester resin. However, fibers from wholly aromatic polyester resin, i.e., polyester resin which has a main chain consisting of aromatic rings as a repeating unit, is preferable. Therefore, fibers from the resin obtained by appropriately combining aromatic diols, aromatic dicarboxylic acids, and/or aromatic hydroxycarboxylic acids are preferable. Particularly, a polyester copolymer of p-hydroxy benzoic acid and 2-hydroxynaphthalene-6-carboxylic acid has a well-balanced properties in spinning property and heat resistance and thus may be preferably used, and a polyester copolymer of p-hydroxy benzoic acid, terephthalic acid and 4,4'-dihydroxybiphenyl has excellent heat resistance, and thus may be preferably used.

Typical aromatic diols, aromatic dicarboxylic acids, and/ or aromatic hydroxycarboxylic acids used to obtain the wholly aromatic polyester are as follow:

(1) Aromatic diols

A compound of the formula (I):

wherein $R^1$ and $R^2$ are independently hydrogen, halogen, such as chlorine, bromine, iodine or fluorine, alkyl, such as lower alkyl having 1 to 4 carbon atoms, or phenyl optionally substituted with one or more halogen atoms, such as chlorine, bromine, iodine or fluorine, or one or more alkyl groups, such as a lower alkyl having 1 to 4 carbon atoms.

A compound of the formula (II):

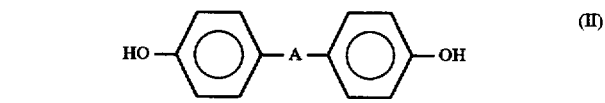

wherein A is —$CH_2$—, —$C(CH_3)_2$— or —$SO_2$—.

Compounds of the following formulae:

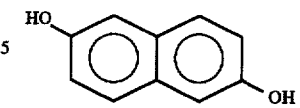

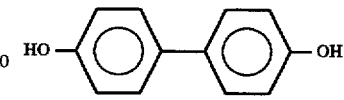

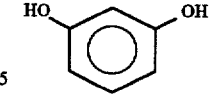

-continued

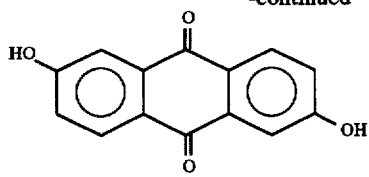

(2) Aromatic dicarboxylic acids

A compound of the formula (III):

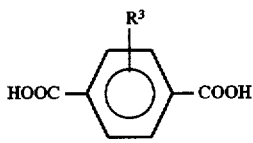
(III)

wherein $R^3$ is hydrogen, halogen, such as chlorine, bromine, iodine or fluorine, or alkyl, such as lower alkyl having 1 to carbon atoms.

Compounds of the following formulae:

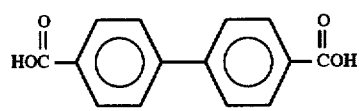

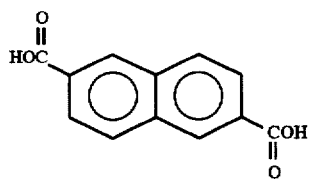

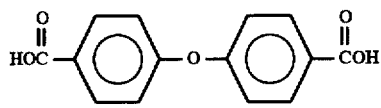

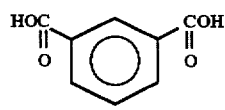

(3) Hydroxycarboxylic acids

A compound of the formula (IV):

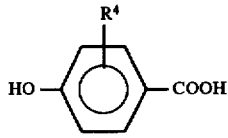
(IV)

wherein $R^4$ is hydrogen, halogen, such as chlorine, bromine, iodine or fluorine, or alkyl, such as lower alkyl having 1 to 4 carbon atoms.

Compounds of the following formulae:

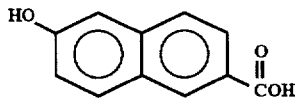

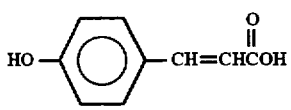

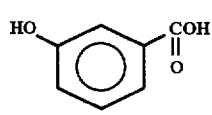

To improve the spinning properties upon spinning the liquid crystal polyester resin, it is possible to incorporate one or more substituents into the aromatic rings, to use one or more non-linear (bent) monomers, and to incorporate one or more folded chains.

Typical examples of a crankshaft unit, bent unit, substituents and folded chains are as follows:

A crankshaft unit:

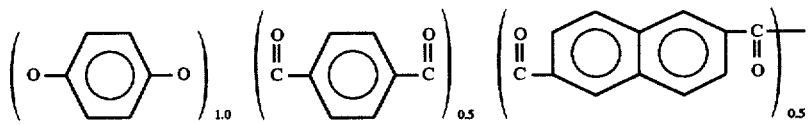

Crankshaft and bent units:

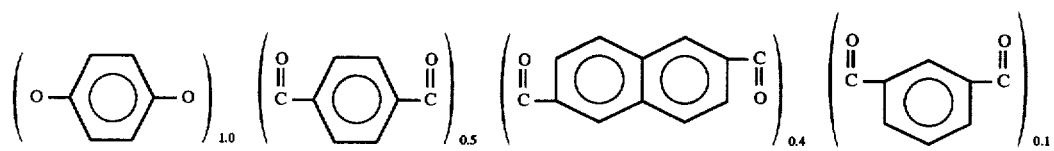

Substituents:

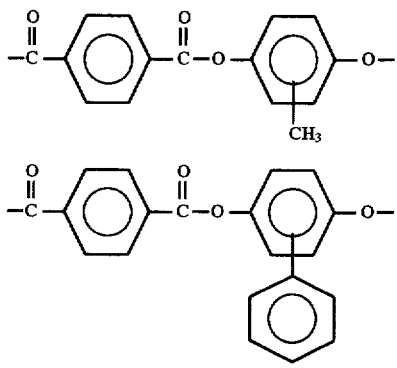

Folded chains:

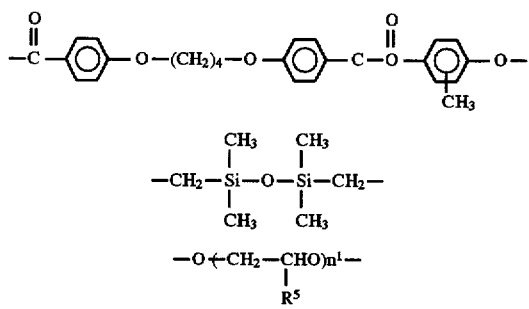

wherein $R^5$ is hydrogen, halogen, such as chlorine, bromine, iodine or fluorine, or alkyl, such as lower alkyl having 1 to 4 carbon atoms, and $n^1$ is an integer of 1 to 6.

It is preferable to heat the liquid crystal polyester fiber obtained by spinning the liquid crystal polyester resin at not lower than the temperature which is about 50° C. lower than the melting point of the liquid crystal polyester resin, or to draw to thereby improve heat resistance. The preferable heat resistance is of the degree that no endothermic peak by melting is observed when a differential scanning calorimeter (DSC) is used for measuring up to 400° C. The fiber having good heat-resistance is preferable, because it has also a good resistance to soldering. The number average molecular weight of the liquid crystal polyester resin forming the liquid crystal polyester fiber is preferably 1000 or more, more preferably 3000 to 50000. The fiber spinned from such a polymer resin has high heat resistance, high strength, high elastic modulus, and high fatigue resistance.

The density (specific gravity) of the liquid crystal polyester fiber used in the present invention is preferably about 1.38 to 1.43, namely lighter than glass fiber. The liquid crystal polyester fiber has low moisture absorbability and low dielectric constant.

The nonwoven fabric may be prepared directly from the liquid crystal polyester fibers, or after cutting the fibers to short fibers. The latter method is preferable because of better uniformity.

The nonwoven fabric of the present invention is not limited so long as it is mainly composed of the liquid crystal polyester fibers, namely the liquid crystal polyester fibers account for not less than 50% by weight of the whole fibers. In view of the dielectric constant and weight, the liquid crystal polyester fibers account for preferably 90% by weight or more, more preferably 100% by weight. Fibers which may be mixed with the liquid crystal polyester fibers are not particularly limited, but are, for example, glass fiber, aromatic polyamide fiber, or polyester fiber.

The fineness of the liquid crystal polyester fiber is preferably 0.1 to 5 denier, and the fiber length is preferably 1 to 150 mm. The fiber web may be obtained by dry and/or wet processes. When the fiber web is prepared by the dry process, the orientating direction of the fibers of the web may be a parallel manner wherein the fibers are parallel to the lengthwise direction of the web, a cross manner wherein the fibers are cross to the lengthwise direction of the web, or a composite manner corresponding to a combination of the parallel and cross manners. The composite manner is preferable, because the thermal expansion coefficient in the lengthwise direction is equivalent to that in the lateral direction, when the printed circuit laminate is formed.

The nonwoven fabric used in the present invention may be prepared by carrying out in any sequential order
(1) the entangling treatment,
(2) the adhesivity-imparting-heating treatment, and
(3) the surface-modifying treatment.

The fiber web may be subjected to the entangling treatment at any stage in the process for manufacturing the nonwoven fabric substrate of the present invention to form the nonwoven fabric and obtain a strength as the nonwoven fabric. The entangling treatment is not limited, but is, for example, a hydro-entangling or needle-punching method. Unnecessary components, such as textile oil or a dispersing agent, can be washed off by the hydro-entangling process, and whereby the surface-modifying treatment can be effectively carried out. Therefore, it is preferable to carry out the hydro-entangling process before the surface-modifying treatment. The hydro-entangling process can densely entangle the fibers to thereby gain good strength. Further, the fibers are generally orientated to the thicknesswise direction. Thus, it is possible to obtain the nonwoven fabric which may be easily impregnated with the thermosetting resin and has a low weight per unit area of 100 g/m² or less. Therefore, the hydro-entangling process is preferable.

When the hydro-entangling process is carried out, it is preferable to use a support of 50 mesh or more for producing a smooth surface on the resulting nonwoven fabric.

It is preferable to use a water-jet nozzle having a diameter of 0.05 to 0.3 mm and a pitch of 0.2 to 3.0 mm, at a jet pressure of 20 to 300 kg/cm² and an angle of about 90° to the fiber web.

The treatment can be carried out more than once. It is preferable to treat both sides of the fiber web once or more and obtain smooth surfaces.

When the nonwoven fabric having a weight per unit area of more than 100 g/m², it is preferable to carry out the needle-punching treatment, and thereafter the hydro-entangling treatment to obtain smooth surfaces.

The adhesivity-imparting-heating treatment of the present invention may be carried out to impart the fabric the adhesivity to the thermosetting resin at any stage in the process for manufacturing the nonwoven fabric substrate. If the fibers are subjected to the adhesivity-imparting-heating treatment, they become stiff and thus difficult to be entangled. Therefore, it is preferable that the entangled nonwoven fabric is subjected to the adhesivity-imparting-heating treatment. The upper limit of the temperature of the adhesivity-imparting-heating treatment is the temperature where the liquid crystal polyester fiber is not decomposed, i.e., the decomposition temperature. When the adhesivity-imparting-heating treatment is carried out at a higher temperature, drill-workability of the laminate prepared from the nonwoven fabric substrate of the present invention is improved. Therefore, it is preferable to carry out the adhesivity-imparting-heating treatment at the highest possible temperature in the range where the form of the nonwoven fabric can be maintained, namely, below the decomposition temperature.

The lower limit of the temperature of the adhesivity-imparting-heating treatment is the lowest possible temperature where the adhesivity to the thermosetting resin can be imparted to the nonwoven fabric substrate of the present invention. The lower limit of the temperature for a combination of a particular nonwoven fabric substrate and a particular thermosetting resin can be concretely determined from a practical standpoint as the substrate for the printed circuit laminate, as follows:

The substrate of the present invention is prepared by subjecting the nonwoven fabric made of the liquid crystal polyester fibers to the entangling treatment, the adhesivity-imparting-heating treatment, and the surface-modifying treatment, and then, the resulting substrate is impregnated with thermosetting resin. The impregnated substrate is dried to obtain a prepreg containing 65 to 70% by weight of resin.

Then, the resulting prepregs are piled to obtain a laminated plate. More concretely, four prepregs are piled. On the both sides, copper foils (thickness=35 μm) are applied. The whole is placed between two mirror plates of stainless steels. Then, lamination is carried out at 40 kg/cm$^2$, and 180° C. for two hours to obtain a laminated plate having thickness of 0.4 to 0.45 mm. The laminated plate is cut to produce a square sample (50 mm×50 mm). A ¾ portion of each of the copper foils is removed by an etching method. The sample is thoroughly washed with water, dried at 120° C. for one hour and treated in a boiling water for 6 hours. Then, a heat resistance upon soldering is measured at 260° C. for 180 seconds. If no blister is observed between the prepreg and the copper foil, and/or the prepreg and the prepreg, or no abnormality is observed, the heat resistance upon soldering for the laminate is acceptable in practice. It can be confirmed that sufficient adhesivity to the thermosetting resin is imparted by the adhesivity-imparting-heating treatment.

The present inventors investigated the lower limit of the temperature of the adhesivity-imparting-heating treatment for various combinations of the nonwoven fabric of the liquid crystal polyester fibers and the thermosetting resins by the above method, and found that the lower limit is the temperature of about 50° C. lower than the heat deformation temperature of the liquid crystal polyester fiber used. The term "heat deformation temperature" means an inflection point of the endothermic peak obtained when measurement is carried out using a differential scanning calorimeter (DSC).

When the adhesivity-imparting-heating treatment is carried out without pressure, it is performed preferably at the temperature lower than the decomposition temperature of the liquid crystal polyester fiber, more preferably at the temperature lower than the temperature where the nonwoven fabric substrate begins to remarkably shrink. For example, when the liquid crystal polyester fiber (heat deformation temperature=320° C.) of p-hydroxy benzoic acid and 2-hydroxynaphthalene-6-carboxylic acid is treated without pressure, the treatment at 270° C. to 360° C. is preferable.

When the adhesivity-imparting-heating treatment is carried out under pressure, the treatment at an elevated temperature may affect the impregnating properties of the nonwoven fabric substrate with the thermosetting resin. The upper limit of the temperature of the adhesivity-imparting-heating treatment under pressure is preferably the temperature which is 20° C. lower than the heat deformation temperature of the liquid crystal polyester fiber, more preferably the temperature which is 30° C. lower than the heat deformation temperature of the liquid crystal polyester fiber. For example, when the liquid crystal polyester fiber (heat deformation temperature=320° C.) of p-hydroxy benzoic acid and 2-hydroxynaphthalene-6-carboxylic acid is treated under pressure, the adhesivity-imparting-heating treatment of the present invention is carried out preferably at 270° C. to 300° C., more preferably at 270° to 290° C. The treatment under pressure means the treatment wherein the nonwoven fabric is passed at a rate of 4 m/min between a pair of stainless steel roles having a linear pressure of 10 kg/cm to 80 kg/cm.

The adhesivity-imparting-heating treatment of the present invention may be carried out using any apparatus, such as a heated calender, an air through-type heat-treating device, or a cylindrical contact-heat treating device. When the heated calender is used, a pressing treatment and an adjustment of the thickness can be performed at the same time. It is more preferable that the pressing treatment is carried out separately from the adhesivity-imparting-heating treatment to smooth the surfaces of the nonwoven fabric and adjust the thickness, because the adhesivity-imparting-heating treatment can be carried out at a higher temperature and the drill-workability is improved. The pressing treatment can be carried out using calender rolls.

The surface-modifying treatment of the present invention may be carried out to impart the fabric the adhesivity to the thermosetting resin at any stage in the process for manufacturing the nonwoven fabric substrate. If the surface-modifying treatment is carried out before the adhesivity-imparting-heating treatment, the adhesivity imparted by the surface-modifying treatment may be deteriorated. It is preferable to carry out the surface-modifying treatment after the adhesivity-imparting-heating treatment. The surface-modifying treatment may be carried out, for example, by physically treating the surface of the nonwoven fabric or the fiber web. The physical treatment is, for example, glow discharging, corona discharging, a plasma treatment, such as a plasma-jet treatment, electron beam radiations, ultraviolet radiations, or sputter etching.

Of the physical treatments, the corona discharging may be preferably used, because the liquid crystal polyester fibers can be effectively treated. The corona discharging is preferably carried out to 0.5 to 3 kilowatt. The liquid crystal polyester fiber can be carbonized when treated over 3 kilowatt, whereas the desired surface-modified effect cannot be obtained when treated under 0.5 kilowatt.

When the nonwoven fabric substrate of the present invention is produced, it is most preferable to first entangle the fiber web mainly composed of the liquid crystal polyester fibers, then carry out the adhesivity-imparting-heating treatment and finally the surface-modifying treatment, because the production processes may be simplified without lowering the adhesivity between the liquid crystal polyester fibers and the thermosetting resin.

A circuit laminate can be produced using the nonwoven fabric substrate of the present invention.

When the circuit laminate is produced, the nonwoven fabric substrate is first impregnated with the thermosetting resin, and dried to obtain a prepreg.

The thermosetting resin which may be used in the present invention may be known usual thermosetting resins which have been used in the prior art to produce a prepreg from a substrate for a printed circuit laminate. As the thermosetting resin which may be used in the present invention, there may be mentioned, for example, phenol, epoxy, unsaturated polyester, cyanate, maleimide or polyimide resin; a resin composition prepared by blending and/or reacting two or more of the above resins; a modified product of one or more of the thermosetting resins with polyvinyl butyral, acylonitrile-butadiene rubber or polyfunctional acrylate compound or an additive; or cross-linked polyethylene, cross-linked polyethylene/epoxy resin, cross-linked polyethylene/cyanate resin, polyphenylene ether/epoxy resin, polyphenylene ether/cyanate resin, or a cross-linked setting resin (IPN or semi-IPN) modified with other thermoplastic resin. When the fiber of p-hydroxybenzoic acid and 2-hydroxynaphthalene-6-carboxylic acid is used as the the liquid crystal polyester fiber, the thermosetting resin containing bismaleimide-triazine resin which has excellent adhesiveness to the fiber, insulating properties and heat resistance may be advantageously used.

The thermosetting resin may be applied to the substrate of the present invention by a known method to produce a prepreg. The thermosetting resin may be applied to the substrate, for example, by impregnating, coating or melt-transferring method. Specifically, there may be mentioned a method wherein the substrate of the present invention is impregnated with vanish prepared by dissolving the thermosetting resin in a solvent, and dried; a method wherein the substrate is impregnated with the liquid thermosetting resin prepared without a solvent at normal or elevated temperature; a method wherein the powdered thermosetting resin is fixed on the substrate of the present invention; or a method wherein a layer of the thermosetting resin is formed on a releasing film or sheet, and the layer is melted and transferred to the substrate of the present invention.

The amount of the thermosetting resin contained in the circuit laminate is not limited, but preferably 30 to 95% by weight with respect to the whole weight of the circuit laminate. If the amount of the resin is less than 30% by weight with respect to the whole weight of the circuit laminate, defective moldings are obtained. If the amount is over 95% by weight, the molding becomes difficult.

The resulting nonwoven fabric carrying the thermosetting resin thereon may be dried by, for example, a vertical dryer, under non-contacting condition, to obtain a prepreg.

The circuit laminate of the present invention is a laminate containing at least one prepreg as mentioned, and thus, involves, for example, a laminate consisting of one or more of the above prepregs, a laminate prepared by combining one or more of the above prepregs and one or more known substrates, such as glass cloth or glass non-woven fabric, a metal foil plated laminate carrying one or both sides of said laminates, an inner-layer plate carrying a printed wiring network for an inner-layer which is formed on said laminates, or a multiple layered laminate prepared using various said laminates.

The metal foil which may be used to produce the metal foil plated laminate carrying the foil on one or two surfaces, may be a known metal foil, such as copper, iron, aluminum or aluminum/copper foil, which is used for a usual metal foil plated laminate. The one or both surfaces of the metal foil may be treated. The metal foil carrying an adhesive may be used.

EXAMPLE

The present invention now will be further illustrated by, but is by no means limited to, the following examples.

Examples 1 to 7 and Comparative Examples 1 to 4

(1) Preparation of Substrate

A fiber web was prepared by a card method from a liquid crystal polyester fiber to which the heating treatment was subjected at 300° C. without drawing [Trade name=Bectran HT, Kuraray: consisting of p-hydroxybenzoic acid and 2-hydroxynaphthalene-6-carboxylic acid: dielectric constant=2.6: no endothermic peak by melting was observed when DSC was used for measuring up to 400° C.] (fineness= 2.5 denier; fiber length=51 mm; density=1.41), so that the weight ratio of the web orientated in the lengthwise direction of the web to the web cross to the lengthwise direction of the web became 1:4.

Then, the fiber web was water-entangled on a support (80 mesh). The diameter of the nozzle was 0.13 mm and the pitch was 0.6 mm. The fiber web was treated at an angle of 90° for the first side at a jet pressure of 80 kg/cm$^2$, then, the reverse side at a jet pressure of 80 kg/cm$^2$, and finally the first side at a jet pressure of 80 kg/cm$^2$, to obtain an entangled nonwoven fabric (weight per unit area=50 g/m$^2$; thickness=0.19 mm; width=30 cm).

The resulting entangled nonwoven fabric was subjected to the adhesivity-imparting-heating treatment, and then, to the corona discharging treatment, as shown in Table 1.

TABLE 1

| | Heating treatment (°C.) | Pressing treatment (kg/cm) | Corona discharging treatment |
|---|---|---|---|
| Example 1 | 270 | 30 (with heating) | Treated |
| Example 2 | 280 | 30 (with heating) | Treated |
| Example 3 | 290 | 30 (with heating) | Treated |
| Example 4 | 280 | 30 (After heated) | Treated |
| Example 5 | 280 | 60 (with heating) | Treated |
| Example 6 | 280 | None | Treated |
| Example 7 | 320 | 150 (After heated) | Treated |
| Comparative Example 1 | 280 | 30 (with heating) | None |
| Comparative Example 2 | 260 | 30 (with heating) | Treated |
| Comparative Example 3 | None | None | Treated |
| Comparative Example 4 | 310 | 30 (with heating) | Treated |

The decomposition temperature of the liquid crystal polyester fiber (trade name =Bectran) in the nonwoven fabric is 400° C. and the heat deformation temperature thereof is 320° C. The temperature range of the adhesivity-imparting-heating treatment is preferably 270° C. to 400° C.

In the "Pressing treatment" of Table 1, the pressing condition when the adhesivity-imparting-heating treatment is carried out is shown. The "with heating" in Table 1 means that the entangled nonwoven fabric was passed at a rate of 4 m/min between the calender rolls which was heated at the temperature shown in "Heating treatment" of Table 1 and which comprised a pair of stainless steel rolls having a slit of 0.05 mm and a linear pressure of 30 kg/cm, 60 kg/cm, or 150 kg/cm. The "After heating" means that the entangled nonwoven fabric was heated by an air through-type heating device, cooled to room temperature, and thereafter passed through the calender rolls as above at room temperature. The "None" means that the pressing treatment was not performed.

The corona discharging treatment was carried out for both sides of the fabric at the output of 1 kilowatt/m and a rate of 4 m/min by a corona discharging device (Kasuga Denki).

No fusion was observed in the nonwoven fabric substrates of Examples 1 to 7 and Comparative Examples 1 to 3, but fusion was observed in the nonwoven fabric substrate of Comparative Example 4.

(2) Preparation of Prepreg

Prepregs were prepared using the nonwoven fabric substrates of Examples 1 to 7 and Comparative Examples 1 to 4.

2,2-Bis(4-cyanatophenyl)propane (900 parts by weight) and bis(4-maleimidephenyl)methane (100 parts by weight) were pre-reacted at 150° C. for 130 minutes. The product was dissolved in a mixture of methyl ethyl ketone and N,N'-dimethylformamide. In the resulting solution, 700 parts by weight of bisphenol A epoxy resin (trade name= Epicoat 1001; epoxy equivalent=450 to 500; Yuka Shell Epoxy) and 0.02 part by weight of zinc octylate were dissolved to obtain vanish. The nonwoven fabric substrates of the liquid crystal polyester fibers prepared in Examples 1 to 7 and Comparative Examples 1 to 4 were impregnated with the vanish and dried to obtain the prepregs containing the resin contents shown in Table 2.

TABLE 2

|  | Resin contents (% by weight) |
| --- | --- |
| Example 1 | 68 |
| Example 2 | 68 |
| Example 3 | 67 |
| Example 4 | 68 |
| Example 5 | 66 |
| Example 6 | 68 |
| Example 7 | 67 |
| Comparative Example 1 | 67 |
| Comparative Example 2 | 68 |
| Comparative Example 3 | 68 |
| Comparative Example 4 | 67 |

Comparative Example 5

E glass plain cloth (number of yarns per 25 mm: warp= 66±2 fibers/25 mm; weft=55±2 fibers/25 mm; weight per unit area=108±5 g/m$^2$) comprising glass fibers (warp=ECE 225 1/0; warp=ECE 225 1/0; density=2.6) was used as a substrate. The substrate was impregnated with the vanish obtained in "(2) Preparation of prepreg" as above, and dried to obtain a prepreg containing 68% by weight of resin.

Comparative Example 6

The procedure of Example 1 was repeated, except that aromatic polyether amide fiber [fineness=1.5 denier; fiber=51 mm; density=1.39; trademark=Technora; Teijin] was used, to obtain an entangled nonwoven fabric (weight per unit area=60 g/m$^2$; thickness=0.22 mm; width=30 cm).

The resulting substrate was impregnated with the vanish obtained in "(2) Preparation of prepreg" as above, and dried to obtain a prepreg containing 68% by weight of resin.

Evaluation of Properties

Four prepregs prepared in each of Examples 1 to 7 and Comparative Examples 1 to 6 were piled. On the both sides, copper foils (thickness=35 µm) were applied. The whole was placed between two mirror plates of stainless steels. Then, lamination was carried out at 40 kg/cm$^2$, and 180° C. for two hours to obtain a laminated plate having thickness of 0.4 to 0.45 mm. For the laminated plates, the following properties were examined and the results are shown in Tables 3 and 4.

(1) Heat resistance at soldering temperature after boiled

Each of the laminated plates was cut to produce a square sample (50 mm.×50 mm). A ¾ portion of each of the copper foils was removed by an etching method. The sample was thoroughly washed with water, dried at 120° C. for one hour and treated in boiling water for 0 hour, 2 hours, 4 hours, 6 hours or 8 hours. Then, a heat resistance upon soldering was measured at 260° C. for 180 seconds. The results, i.e., ○ in the case that no abnormality was observed, and × in the case that blister was produced, are shown in Table 3 (Examples 1 to 7) and Table 4 (Comparative Examples 1 to 6).

(2) Dielectric properties

Dielectric properties were measured by the transformer bridge method (JIS C6481) at 25°±2° C.

(3) Coefficient of thermal expansion

Coefficient of thermal expansion was measured in the thickness direction by a TMA (thermal mechnical analysis) method at a raising rate of 10° C./min.

(4) Peel strength for copper foil

This was measured by JIS C6481 method.

(5) Specific gravity

Each of the laminated boards was cut to produce a square sample (25 mm×25 mm). Each of the copper foils was removed by an etching method. The sample was thoroughly washed with water, dried at 120° C. for 2 hours and the specific gravity was measured by JIS K7112 method.

(6) Workability by drill

The laminated board was piled in the sequential order (from a drill bit side) of an entry board of aluminum foil (thickness=150 µm)/the laminated plate (one plate)/a back-up board of paper phenol (thickness=1.6 mm), and drilled at 3000 bits and 5000 bits. Smears generated in ten openings randomly selected were examined through a microscope, and evaluated in 11 ratings. The case where no resin deposited at copper to the inner-layer pad was observed is evaluated as 10 points, the case where resin was deposited all over the inner-layer copper pad is evaluated as 0 point, and the conditions therebetween are evaluated from 9 to 1 points. The results are shown in Tables 3 and 4. The data in Tables 3 and 4 are the average of 10 openings, and the data in parenthesis () is the lowest. The drilling conditions were as follows:

Diameter of the drill bit=0.35 mm,
Revolutions of the drill bit=80,000 rpm, and
Feed rate of the drill bit=20 µm/revolution (1.6 m/min).

TABLE 3

| Example | 1 | 2 | 3 | 4 | 5 | 6 | 7 |
|---|---|---|---|---|---|---|---|
| Heat resistance at soldering temperature after boiled for | | | | | | | |
| 0 hour | o | o | o | o | o | o | o |
| 2 hours | o | o | o | o | o | o | o |
| 4 hours | o | o | o | o | o | o | o |
| 6 hours | o | o | o | o | o | o | o |
| 8 hours | o | o | o | X | o | X | o |
| Dielectric properties $\epsilon$ | 3.1 | 3.0 | 3.0 | 3.1 | 3.1 | 3.1 | 3.1 |
| tan $\delta$ | 0.0061 | 0.0062 | 0.0061 | 0.0063 | 0.0063 | 0.0062 | 0.0061 |
| Coefficient of thermal expansion | $5.0 \times 10^{-6}$ | $5.0 \times 10^{-6}$ | $5.1 \times 10^{-6}$ | $5.1 \times 10^{-6}$ | $5.1 \times 10^{-6}$ | $5.1 \times 10^{-6}$ | $5.0 \times 10^{-6}$ |
| Peel strength for copper foil (kgf/cm) | 1.45 | 1.46 | 1.46 | 1.44 | 1.45 | 1.44 | 1.47 |
| Plate specific gravity Workability by drill | 1.18 | 1.18 | 1.19 | 1.18 | 1.19 | 1.18 | 1.18 |
| 3000 bits | 8.1(7) | 8.5(7) | 8.8(7) | 7.0(5) | 7.5(5) | 7.6(5) | 9.2(9) |
| 5000 bits | 7.5(5) | 8.0(5) | 8.3(6) | 6.1(5) | 7.0(5) | 7.2(5) | 8.7(8) |

TABLE 4

| Comparative Example | 1 | 2 | 3 | 4 | 5 | 6 |
|---|---|---|---|---|---|---|
| Heat resistance at soldering temperature after boiled for | | | | | | |
| 0 hour | X | o | X | o | o | X |
| 2 hours | X | o | X | o | o | X |
| 4 hours | X | X | X | X | o | X |
| 6 hours | X | X | X | X | o | X |
| 8 hours | X | X | X | X | o | X |
| Dielectric properties $\epsilon$ | 3.1 | 3.1 | 3.2 | 3.1 | 4.6 | 3.4 |
| tan $\delta$ | 0.0062 | 0.0063 | 0.0063 | 0.0062 | 0.0080 | 0.0091 |
| Coefficient of thermal expansion | $5.1 \times 10^{-6}$ | $5.1 \times 10^{-6}$ | $5.1 \times 10^{-6}$ | $5.0 \times 10^{-6}$ | $55.0 \times 10^{-6}$ | $5.4 \times 10^{-6}$ |
| Peel strength for copper foil (kgf/cm) | 1.321 | 1.39 | 1.29 | 1.43 | 1.56 | 1.39 |
| Plate specific gravity Workability by drill | 1.19 | 1.18 | 1.19 | 1.17 | 1.70 | 1.21 |
| 3000 bits | 5.8(4) | 4.9(2) | 2.0(0) | 8.0(6) | 7.2(6) | 2.1(0) |
| 5000 bits | 3.9(2) | 2.8(1) | 1.8(0) | 7.1(5) | 6.7(5) | 1.4(0) |

It is apparent from Tables 3 and 4 that the substrate of the present invention is excellent in heat resistance after boiling and dielectric constant, and is light.

INDUSTRIAL APPLICABILITY

The substrate for the printed circuit laminate according to the present invention has low dielectric constant, is light, exhibits low hygroscopicity, and has good properties to be impregnated with the thermosetting resin and good adhesiveness to the thermosetting resin. Therefore, the printed circuit laminate prepared from the substrate also has low dielectric constant, is light, and exhibits low hygroscopicity. Further, The thermosetting resin is difficult to be peeled from the substrate for the printed circuit laminate, and thus, a defect in insulation is hardly caused.

We claim:

1. A substrate for a printed circuit laminate, comprising a nonwoven fabric which is composed mainly of hydro-entangled liquid crystal polyesters fibers, and which is subjected to (1) an hydro-entangling treatment, (2) a heating treatment to impart adhesivity to a thermosetting resin that is impregnated into the substrate comprising the nonwoven fabric composed mainly of the liquid crystal polyester fiber, and (3) a surface-modifying treatment.

2. The substrate according to claim 1, wherein said heating treatment is carried out under pressure in a temperature range from a temperature which is 50° C. lower than a heat deformation temperature of the liquid crystal polyester fiber to a temperature which is 20° C. lower than heat deformation temperature of the liquid crystal polyester fiber.

3. The substrate according to claim 1, wherein said heating treatment is carried out without pressing, in a temperature range from a temperature which is 50° C. lower than a heat deformation temperature of the liquid crystal polyester fiber to a decomposition temperature of the liquid crystal polyester fiber.

4. The substrate according to any one of claims 1, 2 and 3, wherein said surface-modifying treatment is corona discharging.

5. A printed circuit laminate, characterized by comprising at least one prepreg prepared by impregnating the substrate according to any one of claims 1, 2 and 3 with a thermosetting resin and drying.

6. A printed circuit laminate, characterized by comprising at least one prepreg prepared by impregnating the substrate according to claim 4 with a thermosetting resin and drying.

* * * * *

UNITED STATES PATENT AND TRADEMARK OFFICE
CERTIFICATE OF CORRECTION

PATENT NO.    : 5,692,940
DATED         : December 2, 1997
INVENTOR(S)   : Hidenori Kinbara et al It is certified that error(s) appears in the above-identified patent and that said Letters Patent is hereby corrected as shown below:

Column 13, line 63, change "an hydro-entangling" to --a hydro-entangling--.

Column 14, line 49, change "than heat" to --than the heat--.

Signed and Sealed this

Fourteenth Day of July, 1998

Attest:

BRUCE LEHMAN

*Attesting Officer*          *Commissioner of Patents and Trademarks*